United States Patent
Oishi et al.

(10) Patent No.: US 8,148,753 B2
(45) Date of Patent: Apr. 3, 2012

(54) COMPOUND SEMICONDUCTOR SUBSTRATE HAVING MULTIPLE BUFFER LAYERS

(75) Inventors: Hiroshi Oishi, Kanagawa (JP); Jun Komiyama, Kanagawa (JP); Kenichi Eriguchi, Kanagawa (JP); Yoshihisa Abe, Kanagawa (JP); Akira Yoshida, Kanagawa (JP); Shunichi Suzuki, Kanagawa (JP)

(73) Assignee: Covalent Materials Corporation, Tokyo (JP)

( * ) Notice: Subject to any disclaimer, the term of this patent is extended or adjusted under 35 U.S.C. 154(b) by 187 days.

(21) Appl. No.: 12/659,927

(22) Filed: Mar. 25, 2010

(65) Prior Publication Data
US 2010/0244100 A1  Sep. 30, 2010

(30) Foreign Application Priority Data
Mar. 26, 2009 (JP) .............................. P.2009-076840

(51) Int. Cl.
| | |
|---|---|
| H01L 29/739 | (2006.01) |
| H01L 31/0328 | (2006.01) |
| H01L 31/0336 | (2006.01) |
| H01L 31/072 | (2012.01) |
| H01L 31/109 | (2006.01) |
| H01L 29/06 | (2006.01) |
| H01L 29/22 | (2006.01) |
| H01L 33/00 | (2006.01) |
| H01L 29/24 | (2006.01) |
| H01L 29/732 | (2006.01) |

(52) U.S. Cl. ............ 257/201; 257/12; 257/94; 257/103; 257/183; 257/190; 257/E33.028; 257/E33.033

(58) Field of Classification Search ................. 257/12, 257/94, 103, 183, 190, 201, E33.028, E33.033
See application file for complete search history.

(56) References Cited

U.S. PATENT DOCUMENTS

| | | | | |
|---|---|---|---|---|
| 5,874,747 A  * | 2/1999 | Redwing et al. | ............... | 257/77 |
| 6,998,284 B2 * | 2/2006 | Kyono et al. | ............... | 438/46 |
| 7,148,519 B2 * | 12/2006 | Wu et al. | ............... | 257/97 |
| 7,615,804 B2 * | 11/2009 | Nagahama et al. | ............ | 257/190 |
| 7,638,809 B2 * | 12/2009 | Ohba | ............... | 257/97 |
| 7,652,282 B2 * | 1/2010 | Yanagihara | ............... | 257/19 |
| 7,723,739 B2 * | 5/2010 | Takano et al. | ............... | 257/95 |

(Continued)

FOREIGN PATENT DOCUMENTS

| | | |
|---|---|---|
| JP | 2003-59948 | 2/2003 |
| JP | 2008-205117 | 9/2008 |

*Primary Examiner* — Ida M Soward

(74) *Attorney, Agent, or Firm* — McGinn IP Law Group, PLLC

(57) ABSTRACT

The present invention provides a compound semiconductor substrate, including: a single-crystal silicon substrate having a crystal face with (111) orientation; a first buffer layer which is formed on the single-crystal silicon substrate and is constituted of an $Al_xGa_{1-x}N$ single crystal ($0<x\leq1$); a second buffer layer which is formed on the first buffer layer and is composed of a plurality of first unit layers each having a thickness of from 250 nm to 350 nm and constituted of an $Al_yGa_{1-y}N$ single crystal ($0\leq y<0.1$) and a plurality of second unit layers each having a thickness of from 5 nm to 20 nm and constituted of an $Al_zGa_{1-z}N$ single crystal ($0.9<z\leq1$), said pluralities of first and second unit layers having been alternately superposed; and a semiconductor device formation region which is formed on the second buffer layer and includes at least one nitride-based semiconductor single-crystal layer. The compound semiconductor substrate according to the invention is suitable for use in electronic devices such as HEMTs (high electron mobility transistors).

3 Claims, 2 Drawing Sheets

U.S. PATENT DOCUMENTS

| | | | |
|---|---|---|---|
| 7,745,850 B2 * | 6/2010 | Otsuka et al. | 257/194 |
| 2003/0008440 A1 * | 1/2003 | Udagawa et al. | 438/167 |
| 2003/0012249 A1 * | 1/2003 | Eisenbeiser | 372/96 |
| 2005/0051804 A1 * | 3/2005 | Yoshida | 257/213 |
| 2006/0068601 A1 * | 3/2006 | Lee et al. | 438/761 |
| 2010/0133506 A1 * | 6/2010 | Nakanishi et al. | 257/13 |

* cited by examiner

COMPOUND SEMICONDUCTOR SUBSTRATE HAVING MULTIPLE BUFFER LAYERS

This application is based on a Japanese patent application filed on Mar. 26, 2009 (Application No. 2009-076840), the entire contents thereof being herein incorporated by reference.

FIELD OF THE INVENTION

The present invention relates to a compound semiconductor substrate suitable for use in electronic devices such as HEMTs (high electron mobility transistors) and the like.

BACKGROUND OF THE INVENTION

Nitride semiconductors represented by gallium nitride (GaN), aluminum nitride (AlN), and the like have a higher electron mobility and a wider band gap than silicon, and are expected to be used for implementing an electronic device taking advantage of those features, such as a very-high-speed transistor or a very-low-loss switching device. Because of such excellent material properties, devices employing nitride semiconductors are expected to surpass the devices based on semiconductor silicon, which are mainly used at present, in material-property limit.

As substrates for the epitaxial growth of such a nitride semiconductor thereon, use has hitherto been made of sapphire, silicon (Si), silicon carbide (SiC), zinc oxide (ZnO), and the like. Of these substrates, single-crystal silicon substrates are suitable because the substrates having better crystallinity, a larger area, and a higher purity can be produced at lower cost as compared with the other substrates. In addition, when a single-crystal silicon substrate is used, the device steps currently in use can be employed, without any modification, as subsequent device steps. Use of single-crystal silicon substrates is hence superior also in development cost, and there is a desire for practical use thereof.

However, a comparison between the coefficient of room-temperature expansion of single-crystal silicon substrates and that of nitride semiconductors shows that the coefficient of room-temperature expansion of the nitride semiconductors have a value approximately two times the value for the single-crystal silicon substrates. Because of this, when epitaxial growth is conducted on a single-crystal silicon substrate using a method having a relatively high growth temperature, such as organometallic vapor phase epitaxy, the nitride semiconductor layer undergoes tensile stress and cracks when the substrate temperature is lowered to room temperature after the growth. Furthermore, since the difference in crystal lattice constant between silicon and the nitride semiconductors is as large as 10% or more, there is a problem that the difference causes crystal defects, etc.

In order to overcome those problems, there has been proposed a semiconductor device which includes a single-crystal silicon substrate, a buffer layer which is formed on the substrate and has a multilayer structure, and a semiconductor device formation region formed on the buffer layer (e.g., JP-A-2003-59948).

However, there is a problem that formation of a thick buffer layer and a thick nitride semiconductor layer on a single-crystal silicon substrate by epitaxial growth results in enhanced warpage of the single-crystal silicon substrate. To deposit a buffer layer or nitride semiconductor layer in an increased thickness, on the other hand, has an advantage that the increase in thickness leads to an improvement in the crystallinity of the layers themselves.

For the purpose of reducing warpage, there has been proposed a compound semiconductor substrate which includes a single-crystal silicon substrate and, formed thereon, a buffer layer including: multilayered buffer regions each composed of a plurality of superposed thin unit layers differing in materials and a thick single-layer buffer region having evenness of material and disposed between the multilayered buffer regions (e.g., JP-A-2008-205117).

In general, these multilayered buffer regions are constituted of a combination of two or more materials differing in lattice constant, and the multilayered buffer regions are constituted of either the same nitrides of Group III elements or compounds thereof as device formation regions. InN, GaN, and AlN, which are typical Group III element nitrides, have the following relationship concerning the greatness of lattice constant: InN>GaN>AlN. The lattice constant of a mixed crystal of these (for example, $Al_xIn_yGa_{1-x-y}N$: in which $(x+y) \geq 1$) is determined by the proportions of the components. The higher the proportion of indium, the larger the lattice constant; and the higher the proportion of aluminum, the smaller the lattice constant. When use of GaN in device formation regions is taken into account, it is preferred from the standpoint of conditions for the growth thereof that a mixed crystal of nitrides mainly including GaN and a mixed crystal of nitrides mainly including AlN should be used in the multilayered buffer regions.

However, when the multilayered buffer regions described in JP-A-2008-205117 are formed in such a manner that a mixed crystal mainly including AlN is grown, without reducing crystal quality, under conditions close to optimal growth conditions for a mixed crystal mainly including GaN, then it is necessary to reduce growth rate because the optimal growth conditions for the mixed crystal mainly including AlN include a higher temperature than the optimal growth conditions for the mixed crystal mainly including GaN. Consequently, in the production of a nitride semiconductor substrate employing the above-mentioned multilayered buffer regions, it is desirable for heightening productivity without lowering quality that the proportion of the AlN-based mixed crystal in the multilayered buffer regions should be reduced. However, there is a problem that when the thickness per layer in a multilayered buffer region of the conventional structure is merely reduced in order to lower the proportion of the AlN-based mixed crystal, then there arises a problem that it is difficult to control cracking and warpage.

SUMMARY OF THE INVENTION

An object of the invention, which has been achieved in order to eliminate the technical problems described above, is to provide a compound semiconductor substrate which is capable of inhibiting nitride semiconductor layer from suffering cracking, crystal defects or warpage, and is capable of improving productivity.

The invention provides a compound semiconductor substrate, including:

a single-crystal silicon substrate having a crystal face with (111) orientation;

a first buffer layer which is formed on the single-crystal silicon substrate and is constituted of an $Al_xGa_{1-x}N$ single crystal ($0 < x \leq 1$);

a second buffer layer which is formed on the first buffer layer and is composed of a plurality of first unit layers each having a thickness of from 250 nm to 350 nm and constituted of an $Al_yGa_{1-y}N$ single crystal ($0 \leq y < 0.1$), and a plurality of second unit layers each having a thickness of from 5 nm to 20 nm and constituted of an $Al_zGa_{1-z}N$ single crystal ($0.9<z\leqq1$), said pluralities of first and second unit layers having been alternately superposed; and a semiconductor device formation region which is formed on the second buffer layer and includes at least one nitride-based semiconductor single-crystal layer.

The first buffer layer preferably includes: an AlN unit layer which is formed on the single-crystal silicon substrate and is constituted of an AlN single crystal ($x=1$), and an AlGaN unit layer which is formed on the AlN unit layer and is constituted of an $Al_xGa_{1-x}N$ single crystal ($0<x<1$).

It is preferable that the plurality of first unit layers each are constituted of a GaN single crystal ($y=0$), and the plurality of second unit layers each are constituted of an AlN single crystal ($z=1$).

According to the invention, there is provided a compound semiconductor substrate which is capable of inhibiting nitride semiconductor layer from suffering cracking, crystal defects or warpage, and is capable of improving productivity,

DESCRIPTION OF REFERENCE NUMERALS AND SIGNS

1 Compound semiconductor substrate
10 Single-crystal silicon substrate
20 First buffer layer
30 Second buffer layer
40 Semiconductor device formation region

BEST MODE FOR CARRYING OUT THE INVENTION

The invention will be explained below in more detail with respect to embodiments thereof by reference to the drawings.

Figure 1:
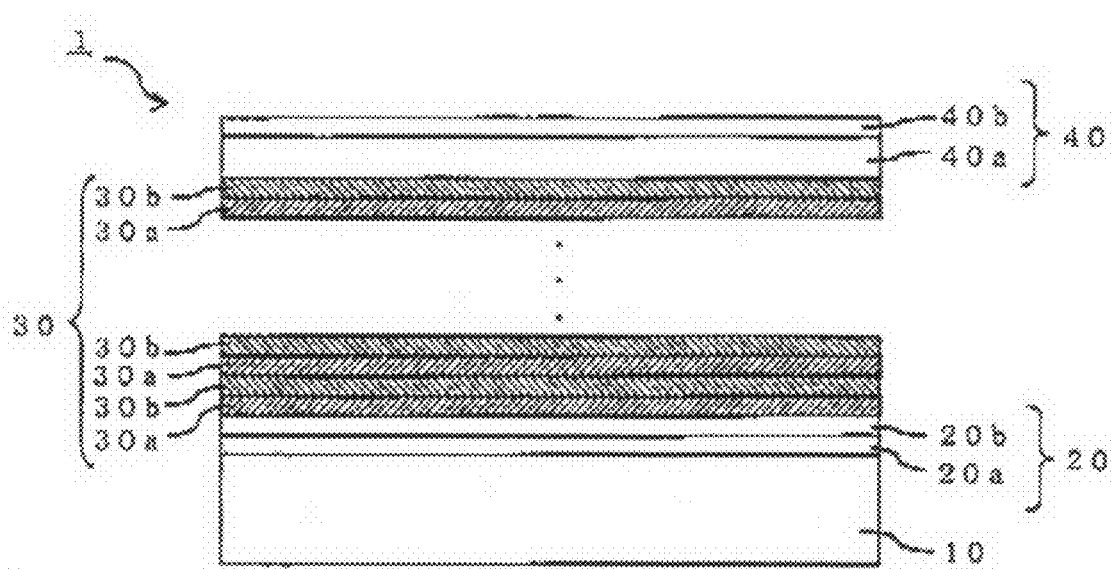
FIG. 1 is a sectional view illustrating one embodiment of the compound semiconductor substrate of the invention.

FIG. 1 is a sectional view illustrating an embodiment of the compound semiconductor substrate of the invention.

As shown in FIG. 1, the compound semiconductor substrate 1 according to this embodiment has a constitution including a single-crystal silicon substrate 10 and, superposed thereon in the following order, a first buffer layer 20, a second buffer layer 30, and a semiconductor device formation region 40.

As the single-crystal silicon substrate 10, use is made of a single-crystal silicon substrate in which the surface where the first buffer layer 20 is to be formed has a crystal face with (111) orientation. The term (111) orientation includes crystal face orientation deflected from (111) orientation by a slight angle (e.g., about ten-odd degrees) or includes crystal face orientation having higher-order plane indices, such as (211) orientation.

Furthermore, a single-crystal silicon substrate produced by the CZ (Czochralski) method is suitable for use as the single-crystal silicon substrate 10. However, the substrate 10 in the invention should not be construed as being limited to that substrate, and use can be made of one produced by the FZ (floating zone) method or one obtained by superposing a single-crystal silicon layer by epitaxial growth on a single-crystal silicon substrate produced using either of those methods.

The single-crystal silicon substrate 10 to be used is, for example, one having a carrier concentration of $1\times10^{16}$ to $1\times10^{21}/cm^3$ (resistivity: about $1-0.00001\ \Omega cm$) and showing n-type conduction.

The first buffer layer 20 is formed on the single-crystal silicon substrate 10 and is constituted of an $Al_xGa_{1-x}N$ single crystal ($0<x\leqq1$).

Since the first buffer layer 20 is constituted of not a GaN single crystal but an $Al_xGa_{1-x}N$ single crystal ($0<x\leqq1$), the surface of the single-crystal silicon substrate can be inhibited, during the formation of the first buffer layer 20, from becoming rough through a reaction between a gallium source and the substrate surface.

Specifically, the first buffer layer 20 is composed of: an AlN unit layer 20a which is formed on the single-crystal silicon substrate 10 and is constituted of an AlN single crystal ($x=1$), and an AlGaN unit layer 20b which is formed on the AlN unit layer 20a and is constituted of an $Al_xGa_{1-x}N$ single crystal ($0<x<1$).

In the invention, the thickness of the first buffer layer is not particularly limited. The thickness of the AlN unit layer 20a is suitably selected from, e.g., the range of from 30 nm to 100 nm.

Since the compound semiconductor substrate according to the invention includes the first buffer layer 20 described above, the surface of the single-crystal silicon substrate can be protected and the nitride semiconductor layers to be formed on the first buffer layer can be inhibited from cracking or developing crystal defects, The second buffer layer 30 is formed on the first buffer layer 20, and has a constitution composed of a plurality of first unit layers 30a each having a thickness of from 250 nm to 350 nm and constituted of an $Al_yGa_{1-y}N$ single crystal ($0\leqq y<0.1$), and a plurality of second unit layers 30b each having a thickness of from 5 nm to 20 nm and constituted of an $Al_zGa_{1-z}N$ single crystal ($0.9<z\leqq1$), the pluralities of first and second unit layers having been alternately superposed.

Figure 2:
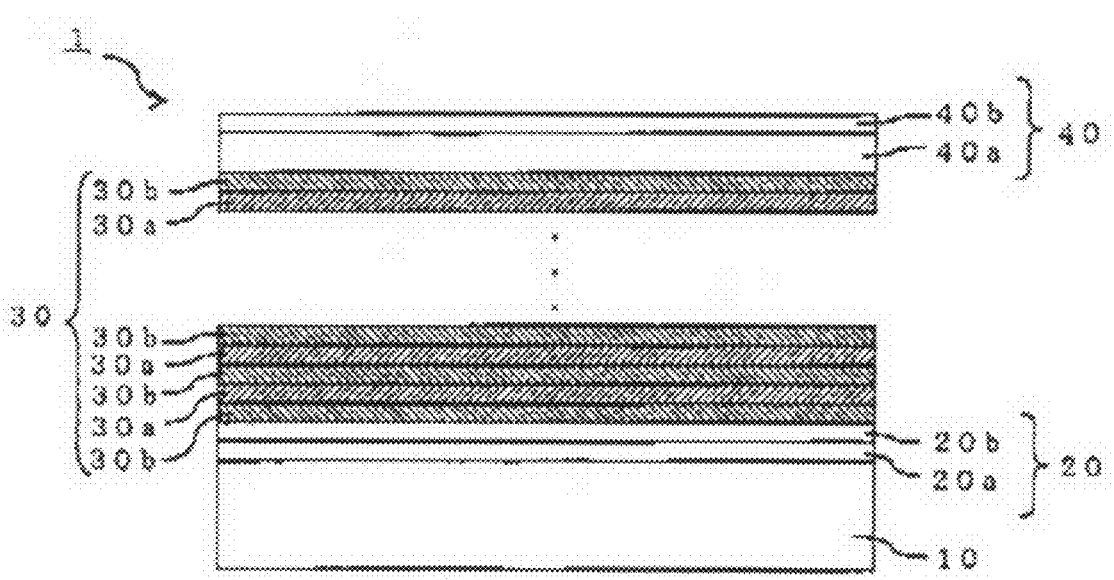
FIG. 2 is a sectional view illustrating another embodiment of the compound semiconductor substrate of the invention.
Figure 3:
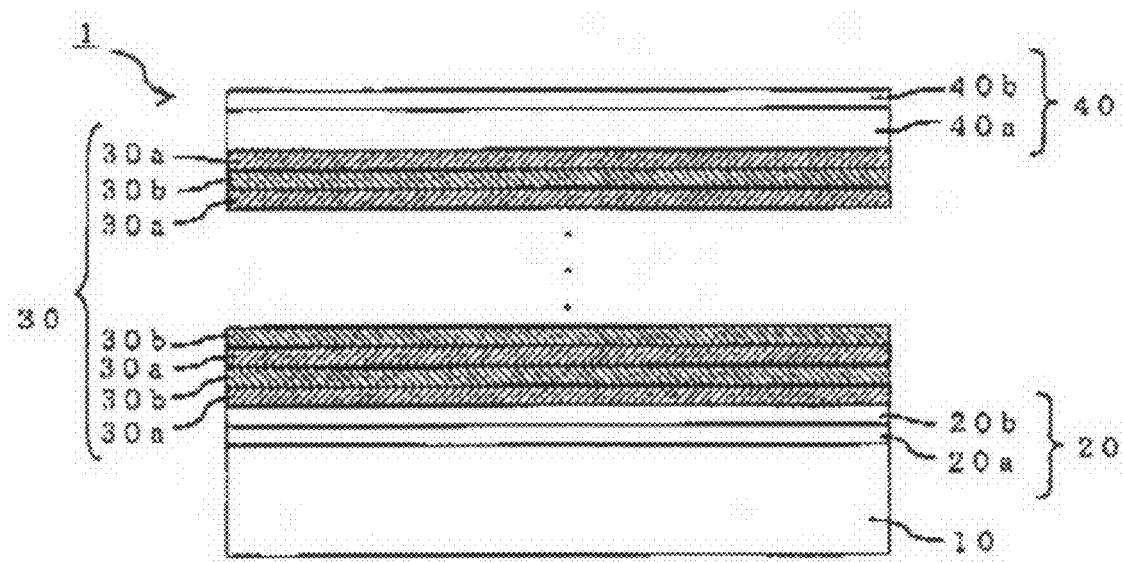
FIG. 3 is a sectional view illustrating still another embodiment of the compound semiconductor substrate of the invention.
Figure 4:
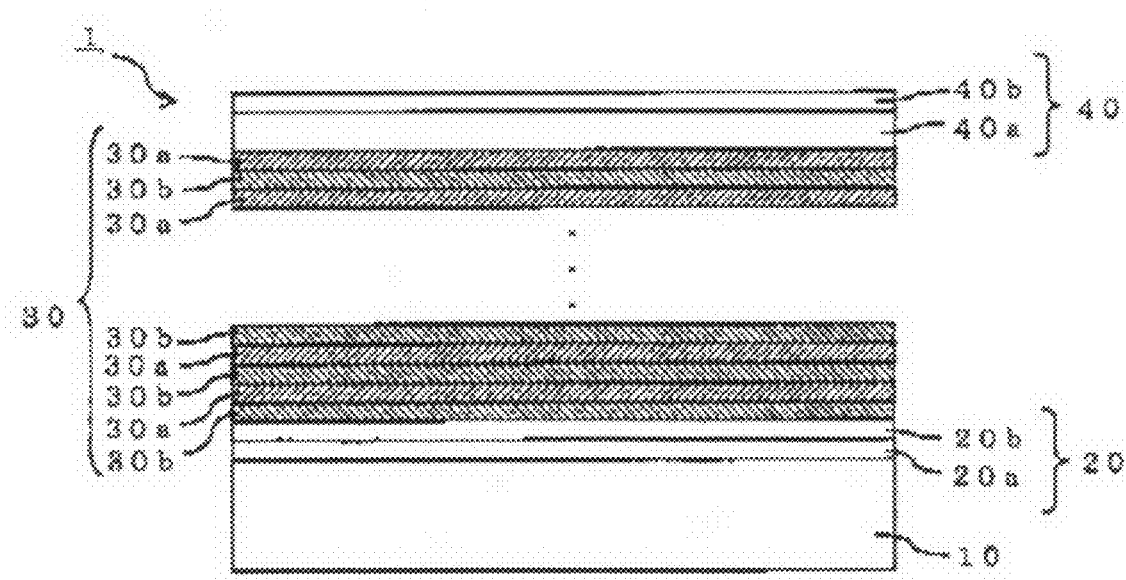
FIG. 4 is a sectional view illustrating a further embodiment of the compound semiconductor substrate of the invention.

The term "the pluralities of first and second unit layers having been alternately superposed" herein includes the following four cases: the case where the lowermost layer and uppermost layer of the second buffer layer 30 are a first unit layer 30a and a second unit layer 30b, respectively (FIG. 1); the case where the lowermost layer and uppermost layer thereof are a second unit layer 30b and another second unit layer 30b, respectively (FIG. 2); the case where the lowermost layer and uppermost layer thereof are a first unit layer 30a and another first unit layer 30a, respectively (FIG. 3); and the case where the lowermost layer and uppermost layer thereof are a second unit layer 30b and a first unit layer 30a, respectively (FIG. 4). Incidentally, the "lowermost layer of the second buffer layer" means the layer in direct contact with the first buffer layer, while the "uppermost layer of the second buffer layer" means the layer in direct contact with the semiconductor device formation region.

As described above, the first unit layers 30a each have a thickness of from 250 nm to 350 nm and are constituted of an $Al_yGa_{1-y}N$ single crystal ($0\leqq y<0.1$).

Because the first unit layers 30a have the constitution described above, the first unit layers 30a are inhibited from cracking or developing crystal defects or the like and can inhibit the occurrence of warpage.

When first unit layers 30a and second unit layers 30b are alternately superposed, compressive stress, which is necessary for warpage inhibition, generates in such an amount which is increased as the thickness of the first unit layers 30a increases. However, thicknesses thereof smaller than 250 nm are undesirable because compressive stress of necessary magnitude does not generate. In case where the thickness thereof exceeds 350 nm, the relationship between film thickness and the amount of compressive stress generated does not hold, and an increase in film thickness results in a limited increase in compressive stress. Because of this, such too large thicknesses make it difficult to inhibit warpage and are hence undesirable.

In case where the first unit layers 30a are constituted of an $Al_yGa_{1-y}N$ single crystal ($0.1 \leq y$), these first unit layers 30a and the second unit layers 30b are alike in composition. In stress control based on a multilayered film, compressive or tensile stress, which is generated when materials differing in lattice constant are deposited so as to have the same lattice, is usually used as a driving force. Because of this, when the first unit layers 30a and the second unit layers 30b have become alike in composition, the driving force is less apt to generate, resulting in cracking, enhanced warpage, etc.

For the reasons given above, it is preferred that the first unit layers 30a each are constituted of a GaN single crystal (y=0).

The second unit layers 30b each have a thickness of from 5 nm to 20 nm and are constituted of $Al_zGa_{1-z}N$ single crystal ($0.9 < z \leq 1$), as described above.

Because the second unit layers 30b have the constitution described above, the second unit layers 30b are inhibited from cracking or developing crystal defects or the like and can inhibit the occurrence of warpage.

In case where the thickness thereof is smaller than 5 nm, it is difficult to impart the function of a buffer layer. In case where the thickness thereof exceeds 20 nm, microcracks generate during deposition of the second unit layers 30b and warpage is also difficult to inhibit.

In case where the second unit layers 30b are constituted of an $Al_zGa_{1-z}N$ single crystal ($z \leq 0.9$), these second unit layers 30b and the first unit layers 30a described above are alike in composition and, hence, the generation of compressive stress decreases, resulting in cracking, enhanced warpage, etc. Such second unit layers 30b are therefore undesirable. For these reasons, it is essential that the constitution of the second unit layers 30b should include $z > 0.9$, and it is more preferred that the layers 30b each are constituted of an AlN single crystal ($z=1$).

Furthermore, as described above, productivity can be improved by forming thick unit layers constituted of an $Al_yGa_{1-y}N$ single crystal ($0 \leq y < 0.1$) (first unit layers 30a) and forming thin unit layers constituted of an $Al_zGa_{1-z}N$ single crystal ($0.9 < z \leq 1$) (second unit layers 30b).

Namely, when such first unit layers 30a and such second unit layers 30b are alternately superposed to form a second buffer layer 30, the formation of a GaN-based mixed crystal and the formation of an AlN-based mixed crystal differ from each other in optimal growth conditions. For example, the temperature for the growth of a GaN-based mixed crystal is about 1,050° C., and the temperature for the growth of an AlN-based mixed crystal is about 1,300° C. or higher. Because of this, when a plurality of layers are superposed, the optimal growth conditions (temperature) must be changed every time when each layer is formed. There is hence a problem that productivity decreases considerably.

A method suitable for successively forming a GaN-based mixed crystal and an AlN-based mixed crystal is as follows. Optimal growth conditions for the GaN-based mixed crystal, which include a low temperature (e.g., 1,050° C.), are regulated so that the temperature is kept constant, and the proportion of the GaN-based mixed crystal, which does not decrease in crystal quality even when formed at a high deposition rate, in the buffer layer 30 is set so as to be high. On the other hand, the proportion of the AlN-based mixed crystal, which must be formed at a low deposition rate in order to prevent crystal quality from decreasing, in the buffer layer 30 is set so as to be low. By thus setting the conditions, productivity in the formation of the second buffer layer 30 can be greatly improved.

The semiconductor device formation region 40 is formed on the second buffer layer 30 and includes at least one nitride-based semiconductor single-crystal layer. The nitride-based semiconductor single-crystal layers are suitably designed according to the specifications of the electronic device to which the compound semiconductor substrate is to be applied, such as an HEMT (high electron mobility transistor). The semiconductor device formation region 40 according to this embodiment includes: a GaN layer 40a formed on the second buffer layer 30 and constituted of a GaN single crystal; and an AlGaN layer 40b formed on the GaN layer 40a and constituted of an $Al_{0.2}Ga_{0.8}N$ single crystal.

The first buffer layer 20, second buffer layer 30, and semiconductor device formation region 40 described above can be formed, for example, by CVD methods including MOCVD (metal organic chemical vapor deposition) and PECVD (plasma enhanced chemical vapor deposition), vapor deposition using a laser beam, sputtering using an ambient gas, etc. Incidentally, in the Example according to the invention, MOCVD was used.

In the second buffer layer, the layer (the lowermost layer of the second buffer layer) which is in direct contact with the first buffer layer 20 preferably is a first unit layer 30a. Namely, it is preferred that the compound semiconductor substrate has the constitution of FIG. 1 or FIG. 3.

When that layer in the second buffer layer (the lowermost layer of the second buffer layer) which is in direct contact with the first buffer layer 20 is a second unit layer 30b (FIG. 2 or FIG. 4), then this layer and the second unit layer (AlGaN unit layer) 20b of the first buffer layer 20, which is constituted of an $Al_xGa_{1-x}N$ single crystal ($0<x<1$), are alike in composition as compared with the case where the lowermost layer is a first unit layer 30a. There is hence a possibility that sufficient compressive stress might not generate. There also is the possibility of posing a drawback that the surface roughness of the first buffer layer 20 cannot be sufficiently eliminated.

The uppermost layer of the second buffer layer 30, which is in contact with the semiconductor device formation region 40, may be either a first unit layer 30a or a second unit layer 30b. The same effect can be obtained in either case.

EXAMPLES

The invention will be explained below in more detail by reference to Examples. However, the invention should not be construed as being limited by the following Examples in any way.

Example 1

A single-crystal silicon substrate 10 having a diameter of 4 inches and a thickness of 500 μm, which had a crystal face with (111) orientation and a carrier density of $1 \times 10^{18}/cm^3$ and showed n-type conduction and which had been produced by the CZ method and mirror-polished on one side, was heat-treated at 1,000° C. in a hydrogen atmosphere to clean the surface.

Subsequently, the substrate temperature was adjusted to 1,150° C., and TMA (trimethylaluminum) and NH$_3$ (ammonia) gas were fed to form an AlN unit layer having a thickness of 100 nm and constituted of an AlN single crystal (20*a* in FIG. 1) on the polished surface of the single-crystal silicon substrate 10. Next, the substrate temperature was adjusted to 1,050° C., and TMG (trimethylgallium) was further fed. The feed amounts of TMA and TMG were regulated to form an AlGaN unit layer having a thickness of 200 nm and constituted of an Al$_{0.2}$Ga$_{0.8}$N single crystal (20*b* in FIG. 1) on the AlN unit layer.

Subsequently, the substrate temperature was adjusted to 1,050° C., and TMG and NH$_3$ gas were fed to form a first unit layer 30*a* constituted of a GaN single crystal on the AlGaN unit layer. Thereafter, while keeping the substrate temperature unchanged at 1,050° C., TMA was fed in place of the TMG to form a second unit layer 30*b* constituted of an AlN single crystal on the first unit layer 30*a*.

The formation of a first unit layer 30*a* and a second unit layer 30*b* described above was repeated several times to form a second buffer layer 30 having an overall film thickness of about 4,000 nm. In this operation, the flow rates of the raw-material gases and the heat treatment periods were regulated to thereby regulate the thickness of each first unit layer 30*a* to 250-350 nm and the thickness of each second unit layer 30*b* to 5-20 nm.

Subsequently, a plurality of samples thus produced were further processed in the following manner. While keeping the substrate temperature unchanged at 1,050° C., TMG and NH$_3$ gas were fed to form a GaN layer 40*a* having a thickness of 2,000 nm and constituted of a GaN single crystal on the second buffer layer 30. Thereafter, TMA was further fed. The feed amounts of TMA and TMG were regulated to form an AlGaN layer 40*b* having a thickness of 50 nm and constituted of an Al$_{0.2}$Ga$_{0.8}$N single crystal on the GaN layer 40*a*. Thus, a plurality of samples were produced.

The compound semiconductor substrates produced by the method described above were examined with an optical microscope and a transmission electron microscope to evaluate the occurrence of cracks, crystal defects, etc. in the semiconductor device formation region 40. Furthermore, warpage was evaluated with a laser displacement gauge.

As a result, no crack or the like was observed in each sample. The number of crystal defects was smaller than $10^9/\text{cm}^2$ and the warpage was 40 µm or smaller, in each sample.

Comparative Example 1

A plurality of samples were produced in the same manner as in Example 1, except that the thickness of each second unit layer 30*b* was regulated to 1 nm.

The compound semiconductor substrates thus produced were examined for the occurrence of cracks in the same manner as in Example 1. As a result, visually recognizable cracks were observed in the surface of the AlGaN layer 40*b* of each sample.

Comparative Example 2

A plurality of samples were produced in the same manner as in Example 1, except that the thickness of each second unit layer 30*b* was regulated to 30 nm.

The compound semiconductor substrates thus produced were examined for the occurrence of cracks in the same manner as in Example 1. As a result, small cracks were observed in the surface of the AlGaN layer 40*b* of each sample. Warpage was also measured in the same manner as in Example 1. As a result, the warpage was found to be about 40 µm. It was ascertained that the warpage itself was approximately the same as in Example 1.

Comparative Example 3

A plurality of samples were produced in the same manner as in Example 1, except that the thickness of each first unit layer 30*a* was regulated to 200 nm.

The compound semiconductor substrates thus produced were examined for the occurrence of cracks in the same manner as in Example 1. As a result, small cracks were observed in the surface of the AlGaN layer 40*b* of each sample. Warpage was also measured in the same manner as in Example 1. As a result, the warpage was found to be about 70 µm. It was ascertained that warpage tended to have been enhanced as compared with Example 1.

Comparative Example 4

A plurality of samples were produced in the same manner as in Example 1, except that the thickness of each first unit layer 30*a* was regulated to 400 nm.

The compound semiconductor substrates thus produced were examined for the occurrence of cracks in the same manner as in Example 1. As a result, small cracks were observed in the surface of the AlGaN layer 40*b* of each sample. Warpage was also measured in the same manner as in Example 1. As a result, the warpage was found to be about 80 µm. It was ascertained that warpage tended to have been considerably enhanced as compared with Example 1.

Comparative Example 5

A plurality of samples were produced in the same manner as in Example 1, except that the first unit layer 20*a* and second unit layer 20*b* described above were not formed.

The compound semiconductor substrates thus produced were examined for the occurrence of cracks in the same manner as in Example 1. As a result, a sample having a mirror surface, far from having no cracks, was unable to be obtained because of melt back etching reaction which occurred between the surface of the single-crystal silicon substrate and the TMG fed for the deposition of a first unit layer 30*a*.

Comparative Example 6

A plurality of samples were produced in the same manner as in Example 1, except that the AlGaN layer 20*b* described above was replaced with a GaN single crystal.

The compound semiconductor substrates thus produced were examined for the occurrence of cracks in the same manner as in Example 1. As a result, the second buffer layer 30 had showed insufficient initial stress relaxation, and large cracks were observed in the surface of the AlGaN layer 40*b* of each sample.

The invention should not be construed as being limited to the embodiments themselves. In carrying out the invention, the constituent elements can be modified so long as the modifications do not depart from the spirit of the invention. By suitably combining a plurality of constituent elements disclosed in the embodiments, the invention can be implemented in various modes. For example, some of all constituent elements shown in an embodiment may be omitted. Furthermore, constituent elements of different embodiments may be suitably combined.

What is claimed is:

1. A compound semiconductor substrate, comprising:

a single-crystal silicon substrate having a crystal face with (111) orientation;

a first buffer layer which is formed on the single-crystal silicon substrate and is constituted of an $Al_xGa_{1-x}N$ single crystal ($0<x\leq1$);

a second buffer layer which is formed on the first buffer layer and is composed of a plurality of first unit layers each having a thickness of from 250 nm to 350 nm and constituted of an $Al_yGa_{1-y}N$ single crystal ($0\leq y<0.1$) and a plurality of second unit layers each having a thickness of from 5 nm to 20 nm and constituted of an $Al_zGa_{1-z}N$ single crystal ($0.9<z\leq1$), said pluralities of first and second unit layers having been alternately superposed; and a semiconductor device formation region which is formed on the second buffer layer and comprises at least one nitride-based semiconductor single-crystal layer.

2. The compound semiconductor substrate according to claim 1, wherein the first buffer layer comprises:

an AlN unit layer which is formed on the single-crystal silicon substrate and is constituted of an AlN single crystal (x=1), and an AlGaN unit layer which is formed on the AlN unit layer and is constituted of an $Al_xGa_{1-x}N$ single crystal ($0<x<1$).

3. The compound semiconductor substrate according to claim 1, wherein the plurality of first unit layers each are constituted of a GaN single crystal (y=0), and the plurality of second unit layers each are constituted of an AlN single crystal (z=1).

* * * * *